United States Patent
Lebo et al.

[19]

[11] Patent Number: 6,133,526
[45] Date of Patent: Oct. 17, 2000

[54] CIRCUIT BOX WITH CABLE SUPPORT

[75] Inventors: Stephen K. Lebo, Falls Church, Va.; Norman S. Saah, Rockville, Md.

[73] Assignee: Hubbell Incorporated, Orange, Conn.

[21] Appl. No.: 09/038,943

[22] Filed: Mar. 12, 1998

[51] Int. Cl.[7] .................................................. H01H 9/02
[52] U.S. Cl. ............................ 174/58; 174/48; 220/4.02; 52/220.8; 312/281
[58] Field of Search ............................. 174/50, 58, 52.4, 174/48; 220/3.2, 3.3, 4.02; 52/220.8; 312/223.6, 9.52, 109, 126, 127, 281, 249.6

[56] References Cited

U.S. PATENT DOCUMENTS

| | | | |
|---|---|---|---|
| 3,055,971 | 9/1962 | Lander | 174/72 A |
| 3,189,394 | 6/1965 | Fay | 312/231 |
| 3,895,179 | 7/1975 | Wyatt | 174/50 |
| 4,449,015 | 5/1984 | Hotchkiss et al. | 174/138 F |
| 4,482,066 | 11/1984 | Dykstra | 211/151 |
| 4,566,054 | 1/1986 | Shimoda et al. | 361/814 |
| 4,592,602 | 6/1986 | Kuster et al. | 312/223.6 |
| 5,731,546 | 3/1998 | Miles et al. | 174/135 |

FOREIGN PATENT DOCUMENTS 2279001  12/1994  United Kingdom ................ 312/223.6

*Primary Examiner*—Kristine Kincaid
*Assistant Examiner*—Dhiro R Patel
*Attorney, Agent, or Firm*—Jerry M. Presson; Mark S. Bicks; Alfred N. Goodman

[57] ABSTRACT

A circuit box includes a housing having a front panel defining one surface of a circuit receiving chamber within the housing. A shelf is rigidly coupled to the housing and extends perpendicularly and outwardly from the housing. A lip extends substantially perpendicularly from an outer end of the shelf remote from the front panel and is substantially parallel to the front panel to define a cable receiving channel with the shelf and front panel. Cable tie wrap retainers can be located on the shelf and within the cable receiving channel.

20 Claims, 4 Drawing Sheets

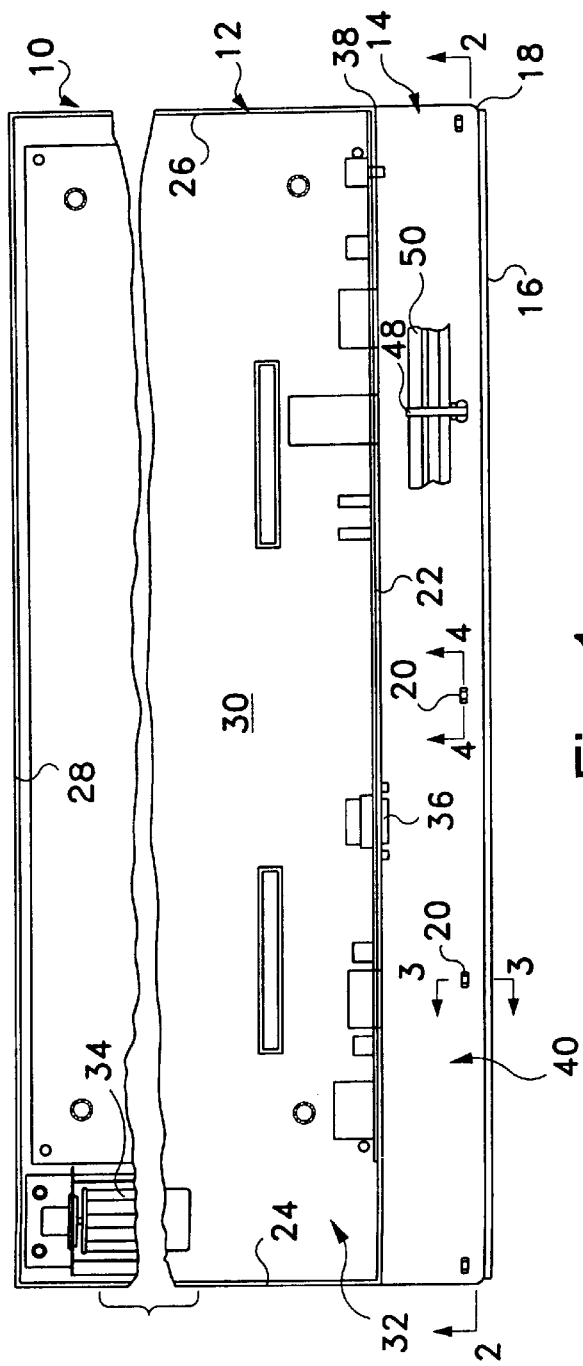
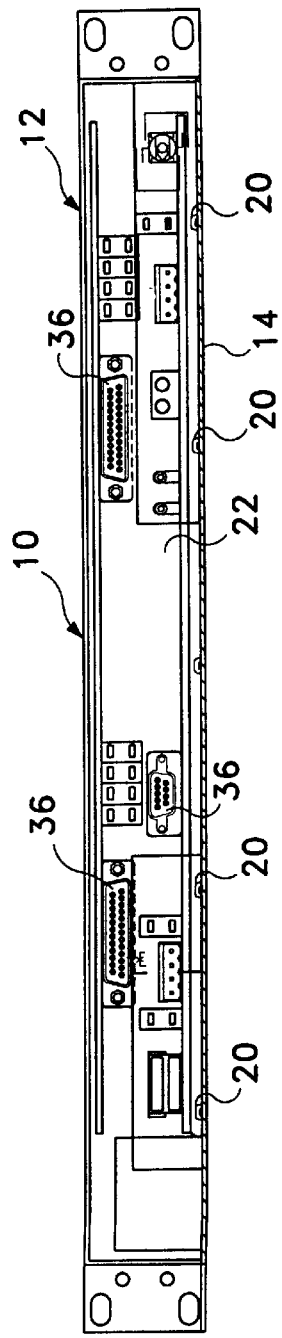
Fig. 1
Fig. 2

CIRCUIT BOX WITH CABLE SUPPORT

FIELD OF THE INVENTION

The present invention relates to a circuit box with a support for the electrical or other cables connected to the front panel of the circuit box. More particularly, the present invention relates to a circuit box having a shelf extending perpendicularly from the front panel of the circuit box. The shelf facilitates attachment of a mechanism for securing the cables to the shelf.

BACKGROUND OF THE INVENTION

Circuit components for many applications, particularly for telephone equipment, are housed in circuit boxes or drawers which can be easily mounted in and removed from a cabinet. Electrical and/or fiber optic connectors are mounted on the front panel of the circuit box. The front panel is exposed in the cabinet to facilitate connection of various cables to the connectors mounted on the circuit box front panel.

Because of the complexity of the equipment and the large number of signal carrying and power cables (electric and/or fiber optic cables), technicians have experienced problems in keeping track of and securing the cables in an appropriate position to allow removal of individual circuit boxes without disturbing the connection of others as necessary. Without proper cable or wire management, the cables and wires can become unwieldy and hinder maintenance and repair operations by hindering the removal and installation of the various circuit boxes.

SUMMARY OF THE INVENTION

An object of the present invention is to provide a shelf or tray that extends from the front panel of a circuit box and is formed as part of the circuit box to provide a mechanism for cable or wire management.

Another object of the present invention is to provide a shelf or tray extending from a circuit box front panel to protect components that protrude from the front of the assembly from impact.

A further object of the present invention is to provide a circuit box with a mechanism for securing wires and cables to a shelf or tray extending from the front panel to provide strain relief for the cables.

The foregoing objects are basically obtained by a circuit box comprising a housing, a shelf rigidly connected to the housing and a lip. The housing includes a front panel defining at least one surface of a circuit receiving chamber in the housing. The shelf extends substantially perpendicularly and outwardly from the housing from an inner end of the shelf adjacent the front panel to an outer end of the shelf remote from the front panel. The lip extends substantially perpendicularly from the shelf outer end and substantially parallel to the front panel to define a cable receiving channel with the shelf and the front panel.

The foregoing objects are also basically obtained by a circuit box comprising a housing, a shelf rigidly coupled to the housing, and cable tie wrap retainers on the shelf. The housing includes a front panel defining at least one surface of a circuit receiving chamber of the housing. The shelf extends substantially perpendicularly and outwardly from the housing from an inner end of the shelf adjacent the front panel to an outer end of the shelf remote from the front panel. A cable receiving surface is provided on the shelf adjacent the front panel.

By forming the electrical box in this manner, the shelf is an integral part of this circuit box assembly. The shelf provides a mechanism for routing, organizing and protecting wires and cables that are attached to the circuit box. Additionally, the shelf protects components that protrude from the front surface of the assembly from being impacted. The shelf, particularly with the cable tie wrap retainers on it, provides a mechanism for attaching the cables securely to the shelf by tie wraps as a strain relief to prevent broken or damaged conductors and loose connections.

Other objects, advantages and salient features of the present invention will become apparent from the following detailed description, which, taken in conjunction with the annexed drawings, discloses preferred embodiments of the invention.

BRIEF DESCRIPTION OF THE DRAWINGS

Referring to the drawings which form a part of this disclosure:

FIG. 1 is a top plan view of a circuit box according to a first embodiment of the present invention;

FIG. 2 is a front elevational view, in section, taken along line 2—2 of FIG. 1;

DETAILED DESCRIPTION OF THE INVENTION

Figure 6:
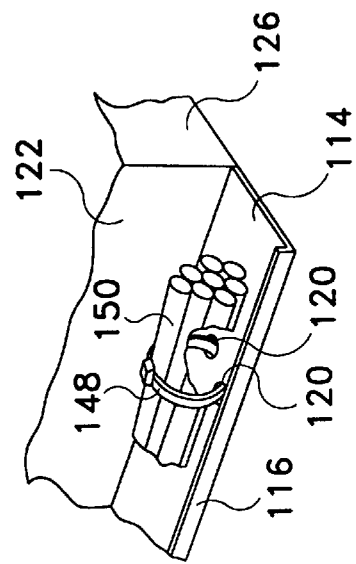
FIG. 6 is an enlarged, partial, perspective view of the circuit box of FIG. 5.
Figure 8:
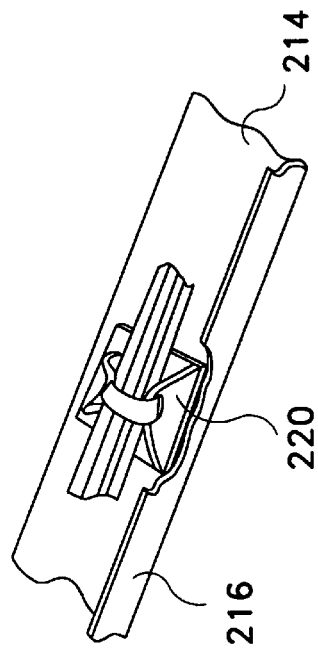
FIG. 8 is an enlarged, perspective view of the circuit box of FIG. 7.
Figure 3:
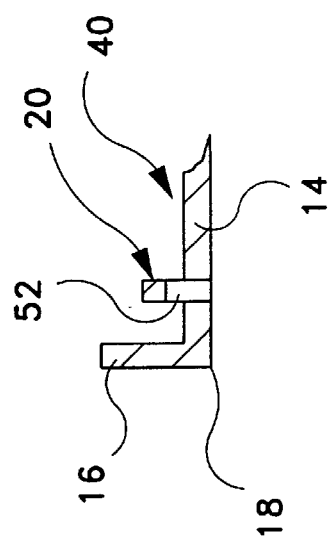
FIG. 3 is an enlarged, partial, side elevational view, in section, taken along line 3—3 of FIG. 1.
Figure 4:
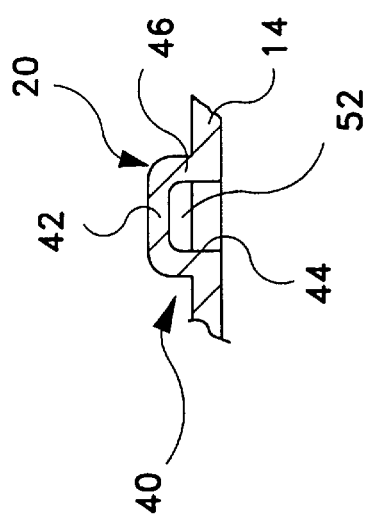
FIG. 4 is an enlarged, partial front elevational view, in section, taken along line 4—4 of FIG. 1.

Referring initially to FIGS. 1–4, a circuit box 10 according to a first embodiment of the present invention comprises a housing 12, a shelf 14 rigidly coupled the housing, and a lip 16 extending substantially perpendicularly from an outer end 18 of the shelf. The shelf 14 includes a plurality of cable tie wrap retainers 20.

Housing 12 comprises a front panel 22, side panels 24 and 26, a back panel 28, and a bottom panel 30. These panels, as; well as a top panel (not illustrated), define the surfaces of a circuit receiving chamber 32, which receives conventional circuitry and components 34. Circuitry and components 34 are electrically coupled to connectors 36 mounted on front panel 22. Other electrical components for the circuit can also be mounted on the front panel to provide access thereto by the operator or technician.

Shelf 14 is formed as a coplanar extension of bottom panel 30 so as to be rigidly coupled to the housing. The shelf is a flat planar member extending substantially perpendicularly and outwardly from the housing with its inner end 38 located adjacent front panel 22 and its outer end 18 located remote from front panel 22. Shelf 14 can also be formed as a separate member from bottom panel 30 and then suitably and rigidly connected to the housing.

Lip 16 is unitarily formed as one piece with shelf 14 and is bent and extends substantially perpendicularly from shelf outer end 18 in the same direction as and parallel to front panel 22. By extending in the same direction as and being spaced from and parallel to front panel 22, the lip defines a cable receiving channel 40 with shelf 14 and front panel 22. The cable receiving channel 40 is open in an upward direction. This channel will receive the wires and cables that are coupled to the connectors mounted on front panel 22. Additionally, the shelf and lip provide a barrier protecting those components mounted on front panel 22 and extending forwardly into the cable receiving channel.

Each of the cable tie wrap retainers 20 are essentially identical in configuration. Thus, only one retainer will be described in detail, with particular reference to FIGS. 3 and 4.

The retainers are spaced between shelf inner end 38 and shelf outer end 18 and are aligned along a line parallel to and spaced closer to outer end 18 than inner end 38. Each retainer comprises an inverted U-shaped member having a bight 42 spaced within channel 40 and spaced from shelf 14 by legs 44 and 46. Legs 44 and 46 extend between and connect bight 42 at its opposite longitudinal ends to shelf 14. The U-shaped members are formed by being cut from the body of shelf 14 and then punched outwardly from the plane of the shelf so as to be located within channel 40.

Conventional tie wraps 48 are used to secure cables 50 to the shelf by looping a portion of the tie wrap through the passage 52 located between bight 42 and shelf 14. After the tie wrap is looped around the cables and passed through passage 52, the ends of the tie wrap can be suitably and conventionally secured to positively retain and manage the cable arrangement on shelf 14.

Figure 5:
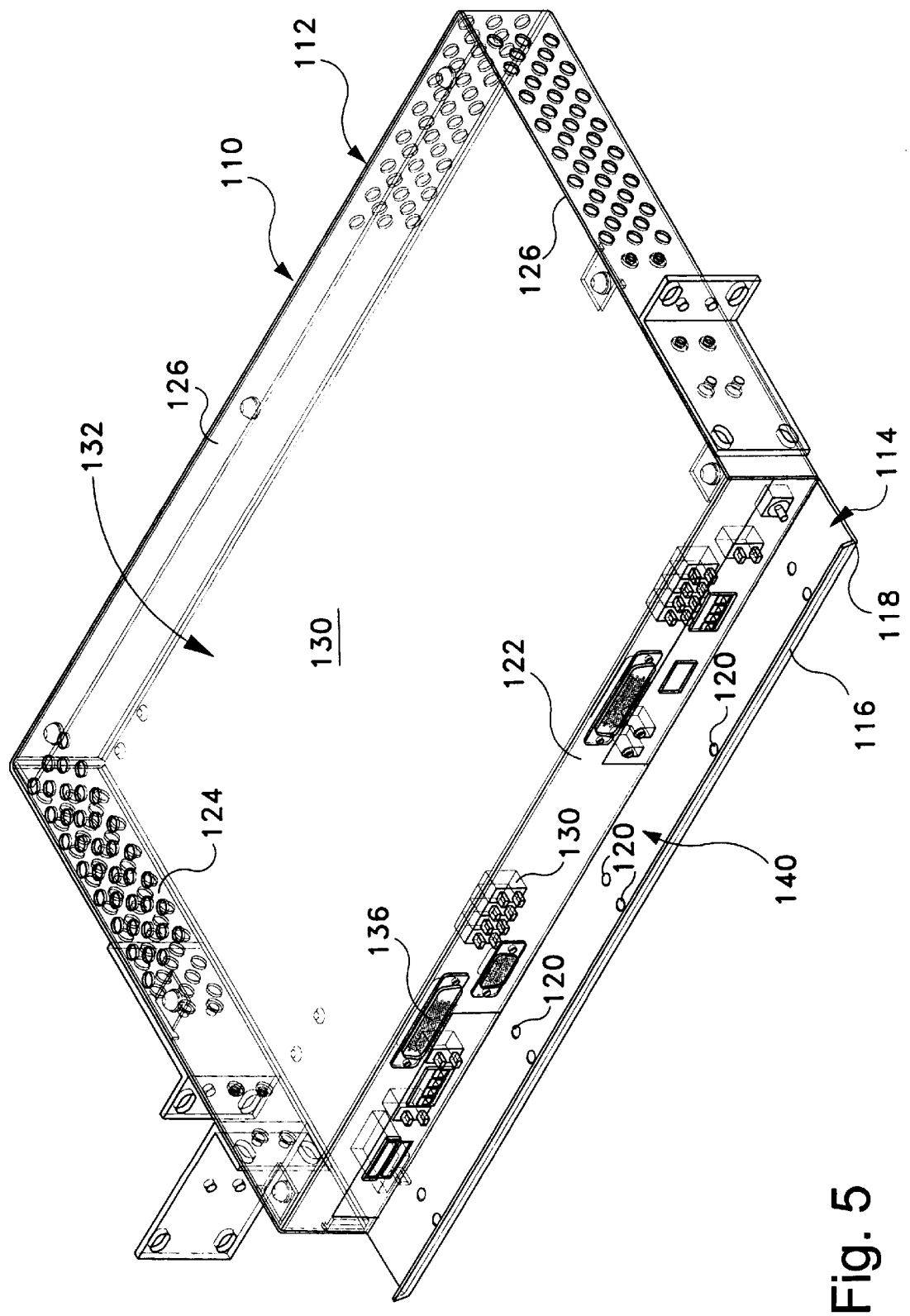
FIG. 5 is a perspective view of a circuit box according to a second embodiment of the present invention.

FIGS. 5 and 6 illustrate a second embodiment of the present invention which principally differs from the first embodiment in the configuration of the cable tie wrap retainers. The circuit box 110 of the second embodiment comprises a housing 112, a shelf 114 rigidly coupled the housing, and a lip 116 extending substantially perpendicularly from an outer end 118 of the shelf. The shelf 114 includes a plurality of cable tie wrap retainers in the form of retainer holes 120.

Housing 112 comprises a front panel 122, side panels 124 and 126, a back panel 128, and a bottom panel 130. These panels define the surfaces of a circuit receiving chamber 132, which receives conventional circuitry and components. The circuitry and components are electrically coupled to connectors 136 mounted on front panel 122. Other electrical components for the circuit can also be mounted on the front panel to provide access thereto by the operator or technician.

Shelf 114 is a coplanar with bottom panel 130, and is rigidly coupled to the housing. The shelf is a flat planar member extending substantially perpendicularly and outwardly from the housing with its inner end 138 located adjacent front panel 122 and its outer end 118 located remote from front panel 122.

Lip 116 is unitarily formed as one piece with shelf 114 and is bent and extends substantially perpendicularly from shelf outer end 118 in the same direction as and parallel to front panel 122. By extending in the same direction as and being spaced from and parallel to front panel 122, the lip defines a cable receiving channel 140 with shelf 114 and front panel 122. The cable receiving channel 140 is open in an upward direction. This channel will receive the wires and cables that are coupled to the connectors mounted on front panel 22. Additionally, the shelf and lip provide a barrier protecting those components mounted on front panel 122 and extending forwardly into the cable receiving channel.

The retainers are circular holes extending perpendicularly through shelf 114, spaced between shelf inner end 138 and shelf outer end 118, and aligned along two lines parallel to and between outer end 118 than inner end 138.

Conventional tie wraps 148 are used to secure cables 150 to the shelf by looping a portion of the tie wrap through one pair of retainer holes 120. After the tie wrap is looped around the cables and passed through the pair of retainer holes 120, the ends of the tie wrap can be suitably and conventionally secured to positively retain and manage the cable arrangement on shelf 114.

Figure 7:
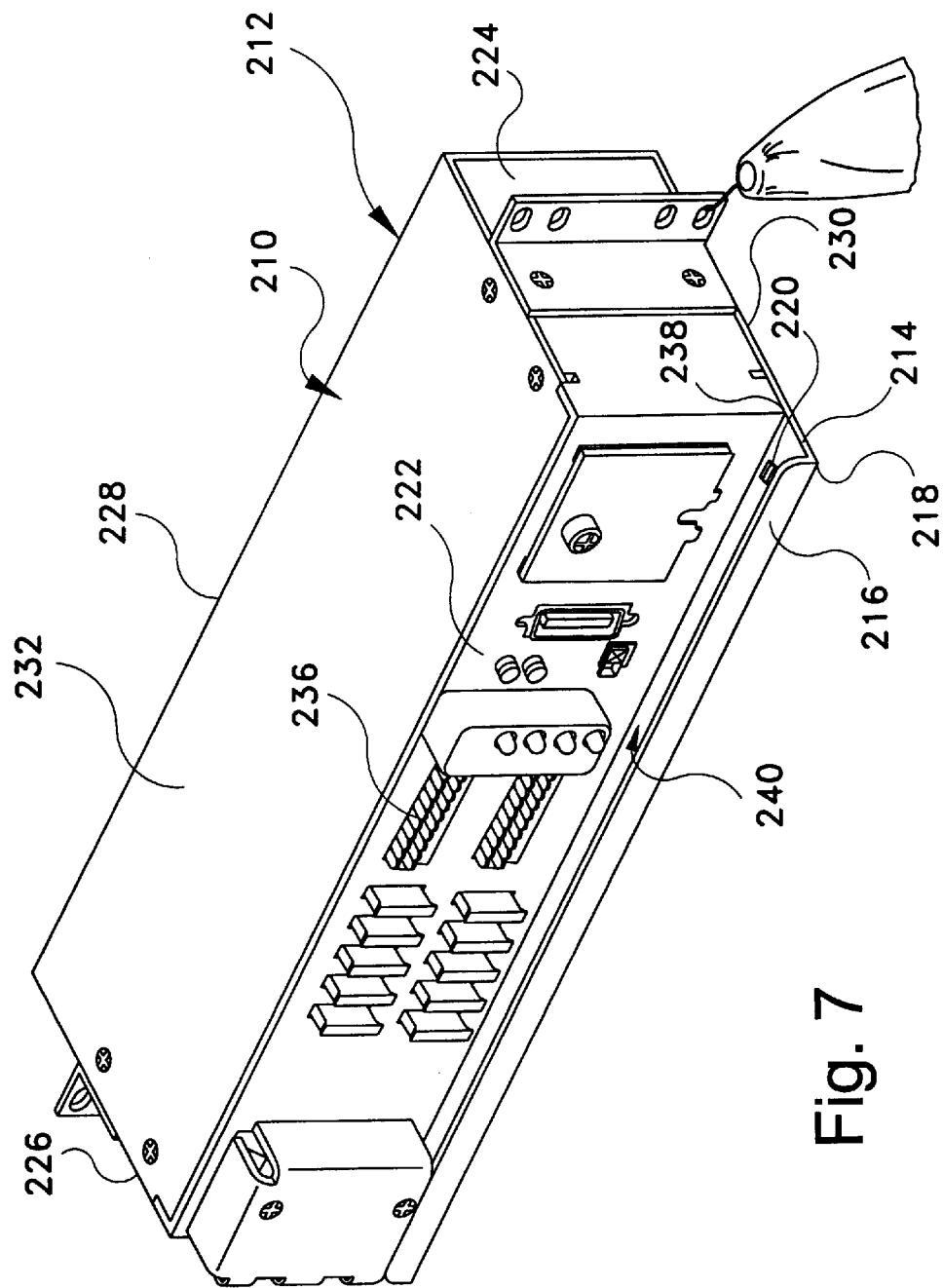
FIG. 7 is a perspective view of a circuit box according to a third embodiment of the present invention.

FIGS. 6 and 7 illustrates a third embodiment of the present invention which principally differs from the first and second embodiments by the use of adhesive in lieu of cable tie wrap retainers. Circuit box 210 of the third embodiment comprises a housing 212, a shelf 214 rigidly coupled the housing, and a lip 216 extending substantially perpendicularly from an outer end 218 of the shelf. The shelf 214 can have conventional and commercially available adhesive backed cable tie mounts 220.

Housing 212 comprises a front panel 222, side panels 224 and 226, a back panel 228, and a bottom panel 230. These panels, as well as a top panel 232, define the surfaces of a circuit receiving chamber, which receives conventional circuitry and components. The circuitry and components are electrically coupled to connectors 236 mounted on front panel 222. Other electrical components for the circuit can also be mounted on the front panel to provide access thereto by the operator or technician.

Shelf 214 is formed as a coplanar extension of bottom panel 230 so as to be rigidly coupled to the housing. The shelf is a flat planar member extending substantially perpendicularly and outwardly from the housing with its inner end 238 located adjacent front panel 222 and its outer end 218 located remote from front panel 222.

Lip 216 is unitarily formed as one piece with shelf 214 and is bent and extends substantially perpendicularly from shelf outer end 218 in the same direction as and parallel to front panel 222. By extending in the same direction as and being spaced from and parallel to front panel 222, the lip defines a cable receiving channel 240 with shelf 214 and front panel 222. The cable receiving channel 240 is open in an upward direction. This channel will receive the wires and cables that are coupled to the connectors mounted on front panel 222 and are secured by cable ties connected to adhesive backed tie mounts 220. Additionally, the shelf and lip provide a barrier protecting those components mounted on front panel 222 and extending forwardly into the cable receiving channel.

While various embodiments have been chosen to illustrate the invention, it will be understood by those skilled in the art that various changes and modifications can be made therein without departing from the scope of the invention as defined in the appended claims.

What is claimed is:

1. A circuit box, comprising:

a housing including a front panel defining at least one surface of a circuit receiving chamber of said housing;

a shelf rigidly coupled to said housing and extending substantially perpendicularly and outwardly from said housing from an inner end of said shelf adjacent said front panel to an outer end of said shelf remote from said front panel; and a lip extending substantially perpendicularly from said outer end of said shelf and substantially parallel to said front panel to define a cable receiving channel with said shelf and said front panel.

2. A circuit box according to claim 1 wherein said shelf comprises cable tie wrap retainers.

3. A circuit box according to claim 2 wherein said retainers are spaced between said inner end and said outer end.

4. A circuit box according to claim 3 wherein said retainers comprise U-shaped members cut and punched from said shelf.

5. A circuit box according to claim 3 wherein said retainers comprise inverted U-shaped members, each said U-shaped member having a bight spaced from said shelf by two legs extending between and connecting said bight and said shelf.

6. A circuit box according to claim 5 wherein each said bight and said legs coupled thereto are located in said channel.

7. A circuit box according to claim 6 wherein closed loop cable ties extend through said retainers to secure said ties and cables surrounded thereby to said shelf.

8. A circuit box according to claim 3 wherein said retainers comprise holes extending substantially perpendicularly through said shelf along axes parallel to said lip.

9. A circuit box according to claim 8 wherein closed loop cable ties extend through said retainers to secure said ties and cables surrounded thereby to said shelf.

10. A circuit box according to claim 1 wherein said shelf comprises adhesive backed cable tie mounts for attaching cables received in said channel.

11. A circuit box, comprising:
a housing including a front panel, defining at least one surface of a circuit receiving chamber of said housing;
a shelf rigidly coupled to said housing and extending substantially perpendicularly and outwardly from said housing from an inner end of said shelf adjacent said front panel to an outer end of said shelf remote from said front panel; and
cable tie wrap retainers on said shelf.

12. A circuit box according to claim 11 wherein said retainers are spaced between inner and outer ends of said shelf.

13. A circuit box according to claim 12 wherein said retainers comprise U-shaped members cut and punched from said shelf.

14. A circuit box according to claim 12 wherein said retainers comprise inverted U-shaped members, each said U-shaped member having a bight spaced from said shelf by two legs extending between and connecting said bight and said shelf.

15. A circuit box according to claim 14 wherein each said bight and said legs coupled thereto are located on a cable receiving surface.

16. A circuit box according to claim 15 wherein closed loop cable ties extend through said retainers to secure said ties and cables surrounded thereby to said shelf.

17. A circuit box according to claim 14 wherein closed loop cable ties extend through said retainers to secure said ties and cables surrounded thereby to said shelf.

18. A circuit box according to claim 12 wherein said retainers comprise holes extending substantially perpendicularly through said shelf along axes parallel to said lip.

19. A circuit box according to claim 18 wherein closed loop cable ties extend through said retainers to secure said ties and cables surrounded thereby to said shelf.

20. A circuit box according to claim 11 wherein closed loop cable ties extend through said retainers to secure said ties and cables surrounded thereby to said shelf.

* * * * *

UNITED STATES PATENT AND TRADEMARK OFFICE
CERTIFICATE OF CORRECTION

PATENT NO. : 6,133,526  
DATED : October 17, 2000  
INVENTOR(S) : Stephen K. Lebo and Norman S. Saah Page 1 of 1

It is certified that error appears in the above-identified patent and that said Letters Patent is hereby corrected as shown below:

Column 2,  
Line 36: before "perspective" insert -- partial --.

Column 3,  
Line 24: after "wraps" insert -- or closed loop cable ties --.

Column 4,  
Line 3: after "wraps" insert -- or closed loop cable ties --.  
Line 10: change "6 and 7" to -- 7 and 8 --.

In the Claims:  
Claim 3, line 3, after "end" insert — of said shelf —.

Signed and Sealed this

Eleventh Day of September, 2001

*Attest:*

*Nicholas P. Godici*

*Attesting Officer*

NICHOLAS P. GODICI  
*Acting Director of the United States Patent and Trademark Office*